US007064957B1

(12) United States Patent
Liang et al.

(10) Patent No.: US 7,064,957 B1
(45) Date of Patent: Jun. 20, 2006

(54) METHODS AND APPARATUS FOR SECURING A HEAT SINK TO A CIRCUIT BOARD COMPONENT

(75) Inventors: Hsing-Sheng Liang, San Jose, CA (US); Michael Chern, San Jose, CA (US); Hong Huynh, Fremont, CA (US); Phillip Ting, San Jose, CA (US); Saeed Seyed, Los Altos Hills, CA (US)

(73) Assignee: Cisco Technology, Inc., San Jose, CA (US)

( * ) Notice: Subject to any disclaimer, the term of this patent is extended or adjusted under 35 U.S.C. 154(b) by 226 days.

(21) Appl. No.: 10/614,908

(22) Filed: Jul. 8, 2003

(51) Int. Cl.
 *H05K 7/20* (2006.01)
(52) U.S. Cl. ..................................... 361/719; 361/709
(58) Field of Classification Search ........ 361/702–704, 361/818, 718, 719, 720, 679, 600, 697, 707, 361/709, 688, 717, 710; 257/726, 727, 719, 257/720; 174/16.3
See application file for complete search history.

(56) References Cited

U.S. PATENT DOCUMENTS

| | | | |
|---|---|---|---|
| 5,175,613 A * | 12/1992 | Barker et al. | 257/713 |
| 6,212,074 B1 * | 4/2001 | Gonsalves et al. | 361/717 |
| 6,304,452 B1 * | 10/2001 | Lo | 361/704 |
| 6,430,052 B1 | 8/2002 | Kordes et al. | 361/719 |
| 6,480,387 B1 * | 11/2002 | Lee et al. | 361/704 |
| 6,498,724 B1 * | 12/2002 | Chien | 361/687 |
| 6,549,410 B1 * | 4/2003 | Cohen | 361/704 |
| 6,552,277 B1 | 4/2003 | Downes | 174/267 |
| 6,714,416 B1 | 3/2004 | McLeod et al. | 361/719 |
| 6,716,072 B1 | 4/2004 | Downes | 439/876 |
| 6,829,143 B1 * | 12/2004 | Russell et al. | 361/704 |

\* cited by examiner

*Primary Examiner*—Lisa Lea-Edmonds
*Assistant Examiner*—Ingrid Wright
(74) *Attorney, Agent, or Firm*—BainwoodHuang (57) ABSTRACT

A heat sink attachment mechanism includes a fastener having an associated compressible member. The fastener defines a flange that, as the fastener secures a heat sink to a circuit board component, is configured to contact a circuit board surface associated with the circuit board component. Contact between the flange and the circuit board minimizes the travel of the fastener relative to the circuit board component and limits the stress generated on the circuit board component or on the solder balls of a ball grid array associated with the circuit boards component by the heat sink. Also, as the fastener secures the heat sink to the circuit board component, the fastener compresses the compressible member against the heat sink, thereby causing the compressible member to expand. Expansion of the compressible member allows the compressible member to absorb changes in the stress applied by the fastener to the heat sink and circuit board component over time.

30 Claims, 6 Drawing Sheets

METHODS AND APPARATUS FOR SECURING A HEAT SINK TO A CIRCUIT BOARD COMPONENT

BACKGROUND

A typical circuit board assembly includes a circuit board formed of circuit board materials (e.g., fiberglass, copper, etc.) and circuit board components mounted to the circuit board. Examples of circuit board components include integrated circuits (ICs), resistors, and inductors. Certain conventional ICs, such as ball grid array (BGA) devices, have an array of solder balls (e.g., solder columns) that attach to contact pads, for example, located on the circuit board. The array of solder balls provides mechanical attachment of the BGA device to the circuit board (e.g., attachment to the contact pads of the circuit board) and provides electrical contact between the BGA device and the circuit board.

Conventionally, circuit board components generate heat during operation. A fan assembly typically generates an air stream that passes over the components and carries the heat away from the circuit board components. The air stream removes the heat so that the components do not operate in an unsafe temperature range, i.e., a relatively high temperature range that would cause the components to operate improperly (e.g., generate a signal incorrectly) or sustain damage (e.g., overheat, burnout, etc.).

Some ICs utilize heat sinks to facilitate cooling. In general, a heat sink is a flanged thermally conductive device, such as a metallic device, that contacts a package of the IC. As the IC generates heat, heat flows from the IC package to the heat sink, and dissipates into the surrounding air. The air stream generated by the fan assembly then carries the heat away, thereby cooling the IC.

As the power requirements for ICs increase, the amount of heat generated by relatively high powered ICs also increases. In turn, the relatively high-powered ICs require larger heat sinks having larger surface areas for heat transfer and heat dissipation of the heat created by the ICs.

Conventional circuit board assemblies use a variety of techniques to secure heat sinks to corresponding circuit board components or ICs in order to maintain thermal contact between the heat sinks and IC packages during operation. One such technique involves the use of a double-sided thermally conductive adhesive, also known as a Pressure Sensitive Adhesive (PSA), to secure the heat sink to the IC package. The PSA contacts a base plate of the heat sink and a surface of the IC package to couple the heat sink and IC package and maintain thermal contact between the heat sink and the IC package and to secure the heat sink to the IC package. Another conventional technique involves the use of fasteners and bolster plates to secure the heat sink to the IC package using the IC's circuit board. Each fastener engages a mounting hole on the heat sink, a mounting hole or through hole defined by the circuit board, and a bolster plate located on a surface of the circuit board component opposite to the surface carrying the IC package. As each fastener engages the corresponding bolster plate, each fastener causes the heat sink to generate a load on the IC package to ensure thermal contact between the heat sink and the IC package.

Another conventional technique involves the use of fasteners and springs to secure the heat sink to the IC package using the IC's circuit board. Each fastener engages a mounting hole on the heat sink, a corresponding spring, and a mounting hole or through hole defined by the circuit board. Each fastener compresses a corresponding spring and causes the heat sink to generate a load on the IC package to ensure thermal contact between the heat sink and the IC package. In such a configuration the springs adjust or absorb a portion of the load exerted by the fasteners on the IC package. Another conventional technique involves the use of spring clips to secure the heat sink to the IC package and maintain thermal contact between the heat sink and IC package. The spring clips contact the heat sink and secure the heat sink to the IC package by attaching directly into openings defined by the circuit board in the area of the IC package.

SUMMARY

Conventional techniques for securing a heat sink to a circuit board component suffer from a variety of deficiencies.

As described above, one conventional technique for securing a heat sink to an IC or circuit board component involves the use of a double-sided thermally conductive adhesive. However, conventional thermally conductive adhesives that have a relatively strong thermal transfer characteristic (e.g., that provide adequate thermal transfer between the heat sink and the circuit board component) also have a relatively weak adhesion characteristic (e.g., provide adhesion of a heat sink to a circuit board component over a relatively short duration of time). For circuit board components that have a relatively large power requirement and that generate a relatively large amount of heat, thermal adhesives having an increased thermal adhesion characteristic should be used. However, the use of such a thermal adhesive has relatively poor adhesion qualities, therefore increasing the risk of the heat sink disassociating from (e.g., falling off) the associated circuit board component and causing overheating of the circuit board component. Overheating of the circuit board component can lead, in turn, to improper operation or malfunction of the circuit board component.

As described above, another conventional technique for securing a heat sink to an IC or circuit board component involves the use of fasteners and bolster plates to secure the heat sink to the IC package using the IC's circuit board. However, the fasteners and bolster plates generate a relatively large stress on the corresponding circuit board component. Certain circuit board components, such as BGA devices, have an array of solder balls or solder columns securing the circuit board component to the circuit board. Typically, constant exposure of the array of solder balls to stresses greater than 10 pounds per square inch (psi) causes the solder balls to creep or deform over time after application and maintenance of the constant stress. Such creep of the solder balls can create a solder joint failure between the circuit board component and circuit board, thereby rendering the associated circuit board assembly inoperable.

As described above, another conventional technique for securing a heat sink to an IC or circuit board component involves the use of fasteners and springs to secure the heat sink to the IC package using the IC's circuit board. As described, each fastener compresses a corresponding spring and causes the heat sink to generate a load on the IC package to ensure thermal contact between the heat sink and the IC package where each spring absorbs a portion of the load exerted by the fasteners on the IC package. Conventionally, however, the fasteners only partially compress the springs. In the case where the circuit board associated with the circuit board component is exposed to a vibration or shock environment, such as caused during shipping of the circuit board, the spring can undergo further extension and retraction. In such a case, as the spring retracts, the heat sink momentarily separates from the circuit board component. As the spring extends, the energy stored in the springs forces the heat sink against the circuit board component causing the heat sink to generate a shock force on the circuit board component. Such a shock force can cause damage to the circuit board component or, in the case of a BGA device, can fracture the solder joint between the circuit board component and the circuit board.

As described above, another conventional technique involves the use of spring clips to secure the heat sink to the IC package. The spring clips couple the heat sink to the circuit board component and secure the heat sink to the circuit board by attaching directly into openings defined by the circuit board in the area of the circuit board component. The holes for the spring clips, however, are relatively large, thereby reducing the area available for electronic components and traces on the circuit board. Furthermore, in this method, after insertion of the spring clips into the openings, each spring clip directly contacts the edge of each opening. Over time, vibrations in the circuit board can cause the spring clip to wear against the hole, thereby abrading the hole and leading to possible failure of the spring clip.

By contrast, embodiments of the present invention significantly overcome such deficiencies and provide mechanisms for securing a heat sink to a circuit board component. A heat sink attachment mechanism includes a fastener, such as a shoulder screw, having an associated compressible member, such as a compliant o-ring. The fastener defines a flange or shoulder that, as the fastener secures the heat sink to the circuit board component, is configured to contact a circuit board surface associated with the circuit board component. Contact between the flange and the circuit board minimizes the travel of the fastener (e.g., stops over travel of the fastener) relative to the circuit board component and, thereby, limits the stress generated on the circuit board component, or on the solder balls of a ball grid array associated with the circuit board component, by the heat sink. Also, as the fastener secures the heat sink to the circuit board component, the fastener compresses the compressible member against the heat sink, thereby causing the compressible member to expand. Expansion of the compressible member allows the compressible member to absorb changes in the stress applied by the fastener to the heat sink and circuit board component over time.

In one arrangement, a heat sink attachment has a fastener and a compressible member. The fastener has a head portion and a shaft portion. The head portion is configured to generate a load on a heat sink to secure and thermally couple the heat sink with a circuit board component. The shaft portion has a flange substantially perpendicular to a long axis defined by the shaft portion, the flange being configured to abut a surface of a circuit board carrying the circuit board component when the fastener secures the heat sink to the circuit board component. The compressible member is in communication with the shaft portion of the fastener and is configured to orient between the head portion and the heat sink. The compressible member has a diameter configured to expand when the head portion compresses the compressible member and generates a relatively small amount of stress on the heat sink as the fastener secures the heat sink to the circuit board component.

Contact between the flange of the fastener and the circuit board causes the fastener to limit the amount of stress applied to the heat sink and the circuit board component by the head portion of the fastener. By limiting the amount of stress applied to the heat sink and the circuit board component fastener minimizes creep (e.g., time dependent deformation caused by application and maintenance of a constant stress) of solder balls of a solder ball array associated with the circuit board component. The compressible member absorbs changes in response to changes in the stress applied by the fastener to the heat sink and circuit board component over time, thereby maintaining the stress on the solder balls of the solder ball array to a level that minimizes creep of the solder balls.

In one arrangement, the shaft portion has a first shaft potion having a first diameter and a second shaft portion having a second diameter less than the first diameter of the first shaft portion, an interface between the first shaft potion and the second shaft defining the flange. The second shaft portion is configured to couple with a side portion of a support member associated with the circuit board when the fastener secures the heat sink to the circuit board component. Such an arrangement maximizes the availability of real estate of the circuit board by minimizing the necessity for the placement of additional through holes in the circuit board for the heat sink attachment mechanisms.

In one arrangement, the first shaft potion of the fastener defines a length relative to a height of a circuit board assembly such that after securing the heat sink to the circuit board component, where the length of the first shaft portion limits deformation of a solder joint between the circuit board component and the circuit board. By limiting deformation of the solder joint, such as solder balls of a solder ball array, the fastener minimizes creep of the solder joint over time and, therefore, limits the potential for fracture of the solder joint as caused by deformation of the solder joint.

In one arrangement, the heat sink attachment mechanism has a trough portion defined by the shaft portion of the fastener where the trough portion extends along the shaft portion about, and substantially perpendicular to, the long axis of the shaft portion, the trough portion being configured to secure the compressible member to the fastener. Use of the trough portion allows a manufacturer to provide the heat sink attachment mechanism as a pre-assembled unit to an end user and save the end user manufacturing costs related to assembling the heat sink attachment mechanism.

The features of the invention, as described above, may be employed in systems, devices and methods for securing a heat sink to a circuit board component as well as other computer-related components such as those of Cisco Systems of San Jose, Calif.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the present invention provide mechanisms for securing a heat sink to a circuit board component. A heat sink attachment mechanism includes a fastener, such as a shoulder screw, having an associated compressible member, such as a compliant o-ring. The fastener defines a flange that, as the fastener secures the heat sink to the circuit board component, is configured to contact a circuit board surface associated with the circuit board component. Contact between the flange and the circuit board minimizes the travel of the fastener relative to the circuit board component and, thereby, limits the stress generated on the circuit board component, or on the solder balls of a ball grid array associated with the circuit board component, by the heat sink. Also, as the fastener secures the heat sink to the circuit board component, the fastener compresses the compressible member against the heat sink, thereby causing the compressible member to expand. Expansion of the compressible member allows the compressible member to absorb changes in the stress applied by the fastener to the heat sink and circuit board component over time.

Figure 1:
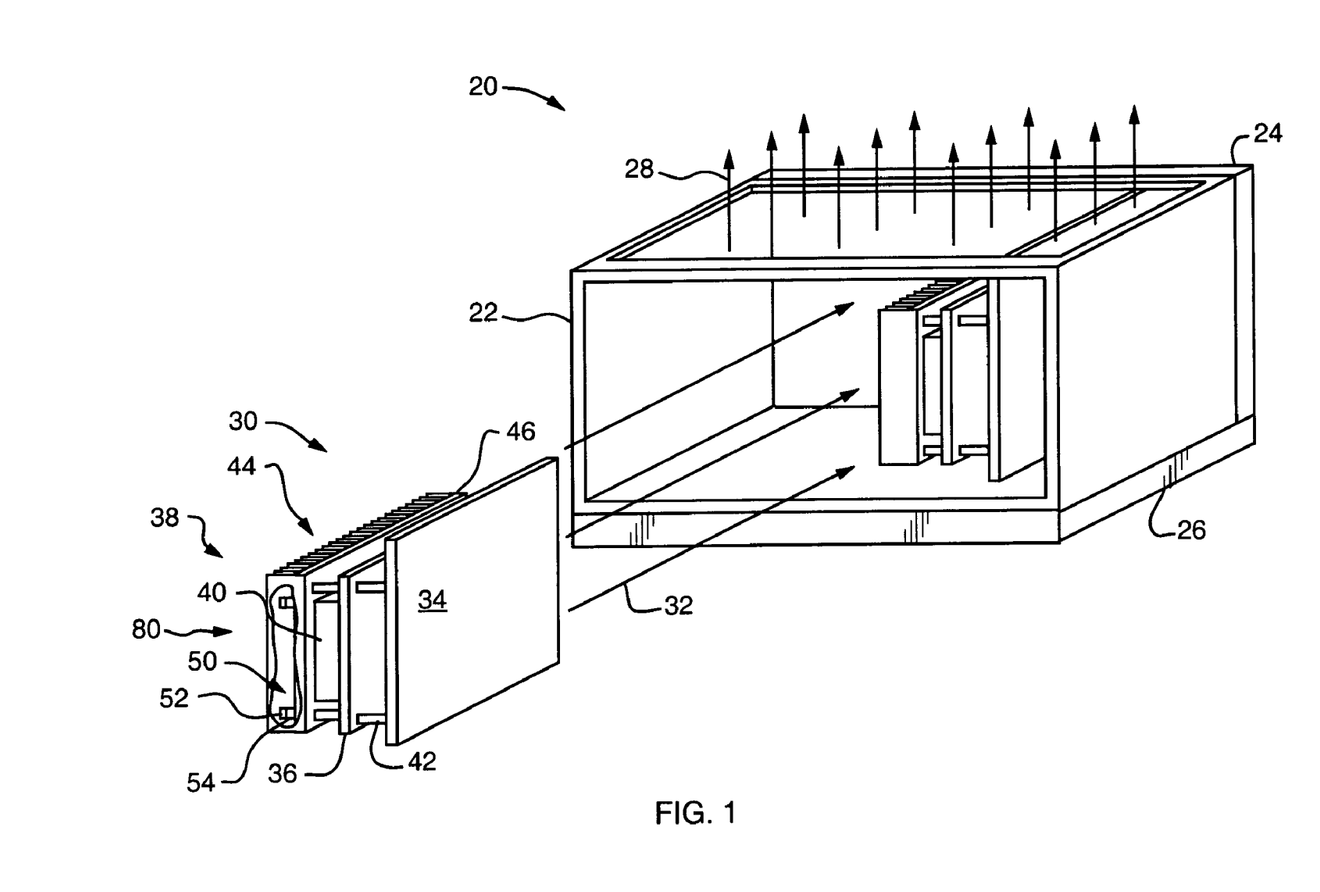
FIG. 1 illustrates a block diagram of a computer system using a heat sink attachment mechanism, according to one embodiment of the invention.

FIG. 1 shows a computer system 20, suitable for use by the invention. The computer system 20 includes a card cage 22, a back plane 24, and a fan assembly 26 that provides an air stream 28 that flows through the card cage 22. The system 20 further includes multiple circuit board assemblies 30 which connect with the back plane 24 when installed in the card cage 22 in the direction 32.

Each circuit board assembly 30 includes, for example, a circuit board 36, a circuit board component 40 mounted to the circuit board 36, a heat sink 38, a heat sink attachment mechanism 50, and a support member 34.

Figure 4:
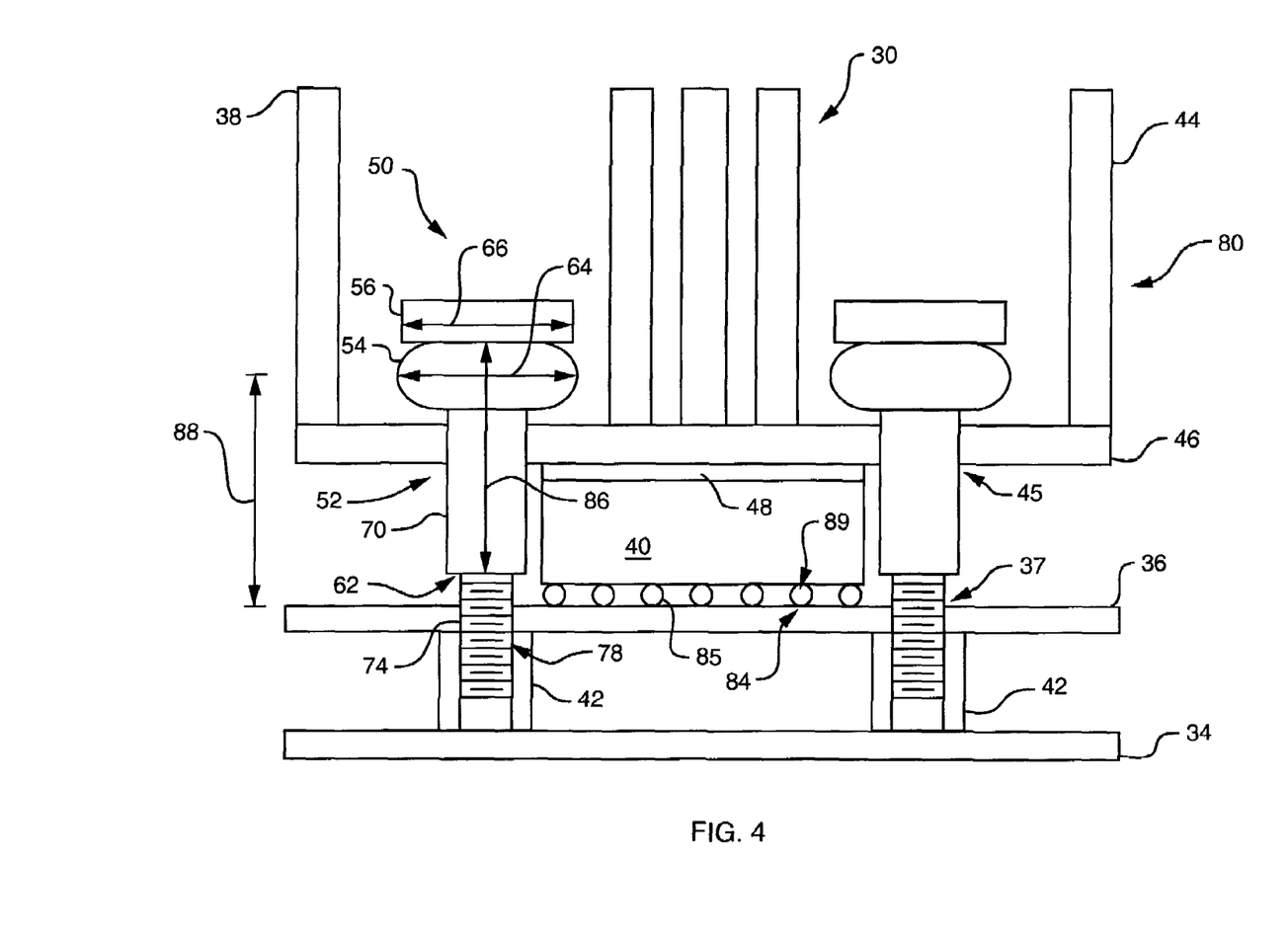
FIG. 4 illustrates a side view of a circuit board assembly having a heat sink attachment mechanism in an unsecured state, according to one embodiment of the invention.

In one arrangement, the circuit board component 40 attaches to the circuit board 36 using a solder ball or solder column array 84, such as illustrated in FIG. 4, for example. The solder ball array 84 forms a solder joint between the circuit board component 40 and the circuit board 36 that provides mechanical attachment of the circuit board component 40 to the circuit board 36 and provides electrical contact between the circuit board component 40 and the circuit board 36.

Returning to FIG. 1, the heat sink 38 facilitates cooling of the circuit board component 40. In one arrangement, the heat sink 38 is made from a material having relatively high heat conduction characteristics (e.g., a metallic material such as aluminum) to allow heat transfer from the circuit board component 40 to the heat sink 38. The heat sink 38, in one arrangement, has a base plate 46 and fins 44 (e.g., extruded from the base plate 46) to aid in heat transfer from the circuit board component 40. The base plate 46 couples to the circuit board component 40 such that the fins 44 of the heat sink 38 orient within the card cage 22, and relative to the air stream 28 provided by the fan assembly 26, to allow the air stream 28 to flow across the fins 44. In such an arrangement the fins 44 minimally impinge upon the air stream 28. The base plate 46 receives heat from the circuit board component 40 and transfers the heat to the fins 44. As the air stream 28 travels past the surface area of the fins 44, the air stream 28 carries heat away from the heat sink 38 (e.g., convective cooling), thereby cooling the circuit board component 40.

In one arrangement, the heat sink 38 attaches to a thermal interface material 48 located between the base plate 46 of the heat sink 38 and the circuit board component 40, such as illustrated in FIG. 4. In one arrangement, the thermal interface material 48 is a compressible thermal putty or thermal clay such as Fuji Poly XE-110. The thermal interface material 48 conforms to an upper surface of the circuit board component 40 and to a surface of the base plate 46 contacting the thermal interface material 48. The thermal interface material 48, therefore, maximizes the surface area of the base plate 46 in thermal communication with the circuit board component 40 and limits the presence of gaps or spaces between the base plate 46 and the circuit board component 40, such as caused by tolerance differences between the two components 46, 40. By maximizing contact between the heat sink 38 and the circuit board component 40, the thermal interface material 48 helps to increases the amount heat transferred from the circuit board component 40 to the heat sink 38.

Returning to FIG. 1, the support member or carrier tray 34 couples to the circuit board 36 via side portions or stand-offs 42 attached to the support member 34 and operates as a carrier for holding the circuit board 36 in place for proper alignment and connection with the back plane 24. In one arrangement, the support member 34 includes a metallic material that shields circuitry of the circuit board assembly 30 from external electromagnetic interference (EMI) sources and that shields external circuitry from EMI generated by the circuitry of the circuit board assembly 30.

The heat sink attachment mechanism 50, illustrated via a cut away portion of a fin 44 of the heat sink 38, thermally couples the heat sink 38 to the circuit board component 40. Together the heat sink attachment mechanism 50 and the heat sink 38 form a heat sink assembly 80. The heat sink attachment mechanism 50 limits an amount of stress applied to the heat sink 38 and the circuit board component 40 when securing the heat sink 38 to the circuit board 36. The heat sink attachment mechanism 50 is also configured to maintain the amount of stress applied to the heat sink 38 and the circuit board component 40 at a substantially constant level over time.

Figure 2:
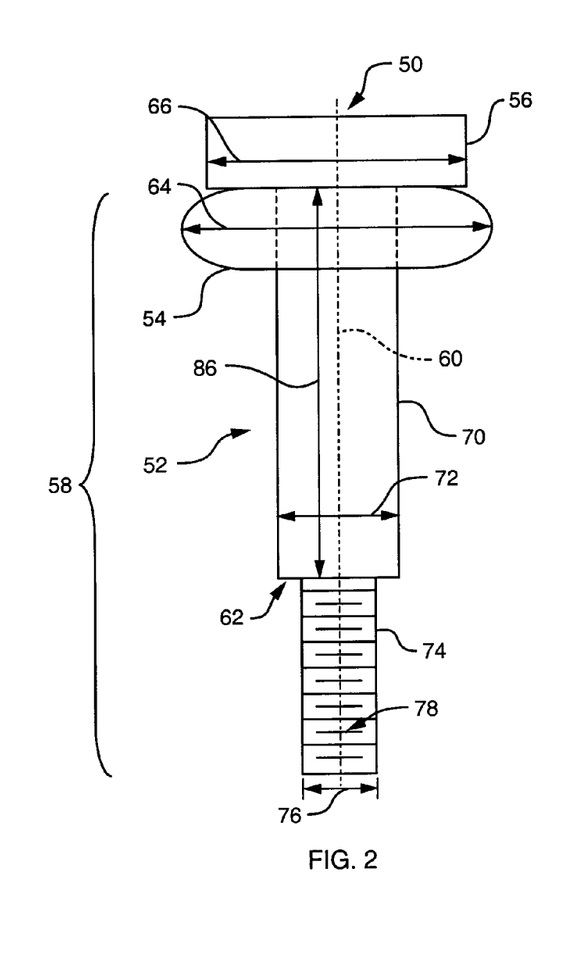
FIG. 2 illustrates a side view of the heat sink attachment mechanism of FIG. 1, according to one embodiment of the invention.
Figure 3:
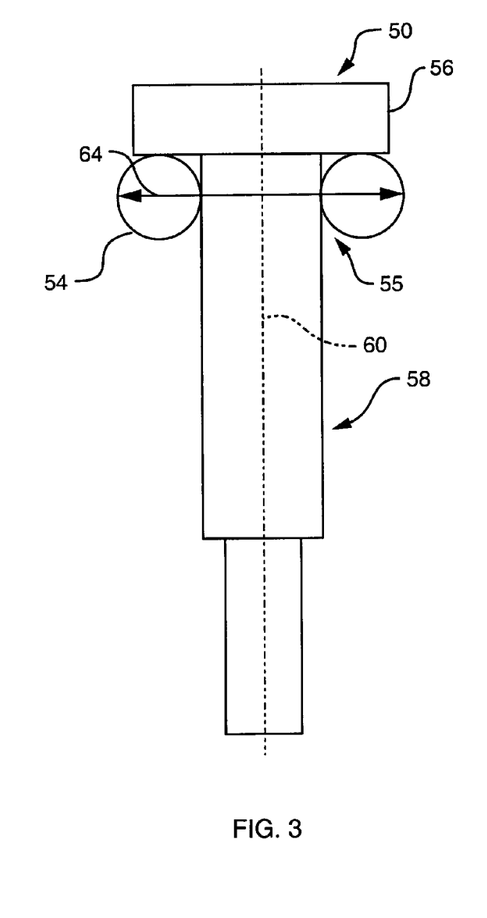
FIG. 3 illustrates a sectional view of the heat sink attachment mechanism of FIG. 1, according to one embodiment of the invention.

FIGS. 2 and 3 illustrate, in one arrangement, a side view and a sectional view, respectively, of the heat sink attachment mechanism 50. The heat sink attachment mechanism 50 has a fastener 52 and a compressible member 54.

The fastener 52 has a head portion 56 and shaft portion 58 in communication with the head portion 56. The head portion 56 of the fastener 52 is configured to generate a stress on a heat sink 38 to secure and thermally couple the heat sink 38 with a circuit board component 40. The shaft portion 58 of the fastener 52 defines a long axis 60 and a flange or shoulder 62 substantially perpendicular to the long axis 60 of the fastener 52. The flange 62 is configured to abut a surface of a circuit board 36 carrying the circuit board component 40 when the fastener secures the heat sink 38 to the circuit board 36.

Contact between the flange 62 of the fastener 52 and the circuit board 36 causes the fastener 52 to limit the amount of stress applied to the heat sink 38, the circuit board component 40, and the solder ball array 84 when the fastener 52 secures the heat sink 38 to the circuit board component 40, as described below. By limiting the amount of stress applied to the heat sink 38, the fastener 52 minimizes or substantially prevents damage to the circuit board component 40 in thermal communication with the heat sink 38 (e.g., damage as caused by exposure to a relatively large stress). Furthermore, by limiting the amount of stress applied to the heat sink 38 to a level below the stress level causing deformation of solder balls 85 of a solder ball array 84 (e.g., a stress level below approximately 10 pounds per square inch (psi)), the fastener 52 minimizes creep (e.g., time dependent deformation caused by application and maintenance of a constant stress) of the solder balls 85 in the solder ball array 84 associated with the circuit board component 40.

Figure 5:
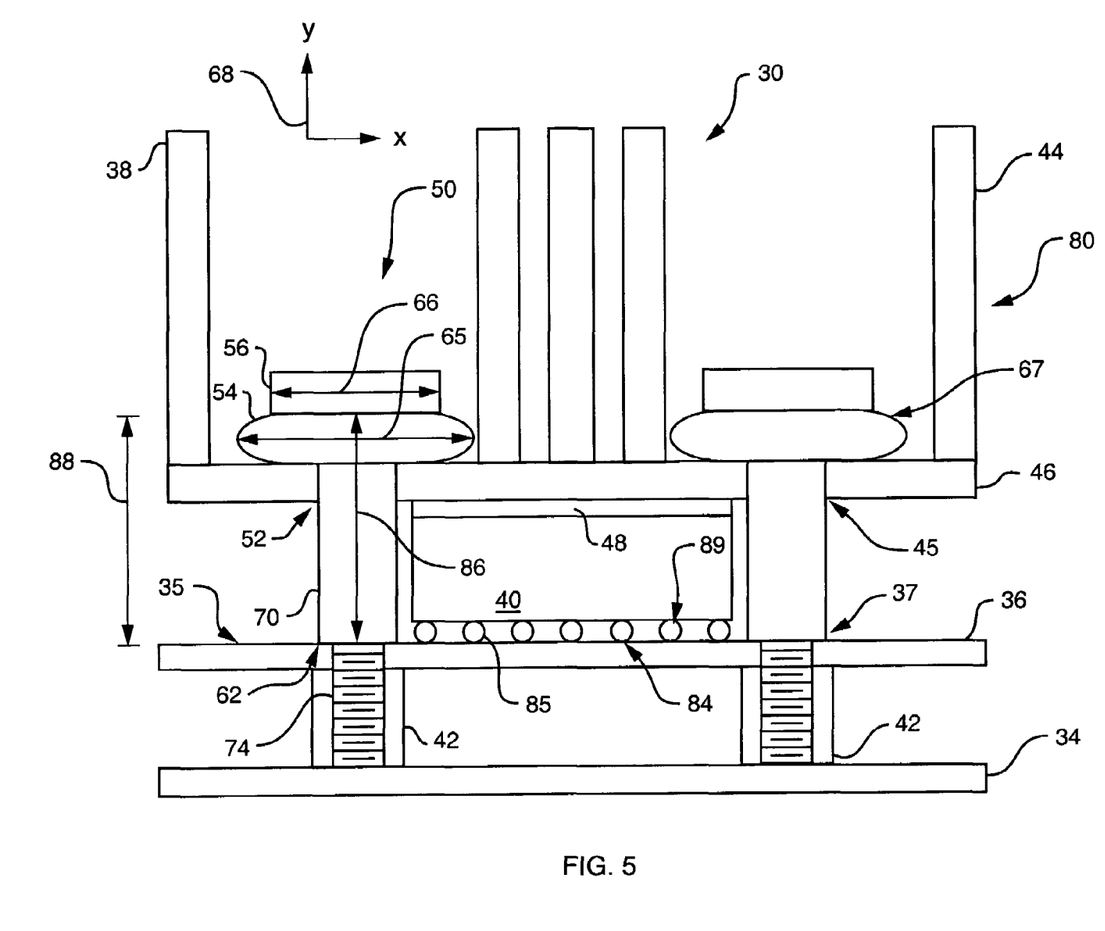
FIG. 5 illustrates a side view of a circuit board assembly having a heat sink attachment mechanism in a secured state, according to one embodiment of the invention.

In one arrangement, in the case where the fastener 52 is a screw having the flange 62, as the fastener 52 secures the heat sink 38 to the circuit board component 40, contact between the flange 62 and the circuit board surface 35 minimizes an increase in stress applied to the heat sink 38, circuit board component 40, or solder ball array 84 as caused by over-torquing of the fastener 52. For example, during assembly, when the flange 62 of the fastener 52 contacts or abuts the surface 35 of the circuit board 36, such as illustrated in FIG. 5, such contact between the flange 62 and the circuit board surface 35 limits or prevents the head portion 56 of the fastener 52 from traveling along a y-direction 68 toward the circuit board 46. While the head portion 56 does generate a stress on the heat sink 38 (e.g., the heat sink base 46) during assembly, the flange 62 acts as a "stop" for the fastener 52 and limits the stress generated by the head portion 56 on the heat sink 38 to a stress of less than approximately 10 psi, for example. Once the flange 62 contacts the surface 35 of the circuit board 36, any stress generated by additional torque applied to the fastener 52 (e.g., over-torquing) is transferred to the circuit board 36. The stress generated by additional torque applied of the fastener 52 does not increase the stress generated by the fastener on the heat sink 38, circuit board component 40, or solder ball array 84.

As stated, the contact between the flange 62 of the fastener 52 and the circuit board 36 causes the fastener 52 to limit the amount of stress applied to the heat sink 38 and the circuit board component 40 by the head portion 56 of the fastener 52. Such contact between the flange 62 and the circuit board 36 also allows the head portion 56 to provide compressive stress on the heat sink 38 to ensure thermal contact between the heat sink 38 and the circuit board component 40 during the operational life of the circuit board assembly 30.

Returning to FIGS. 2 and 3, the compressible member 54, in one arrangement, encircles the shaft portion 58 of the fastener 52 relative to the long axis 60 of the fastener 52. For example, as indicated by the sectional view in FIG. 2, the compressible member 54 is torroid or o-ring shaped and defines an aperture 55. In one arrangement, the shaft portion 58 engages the aperture of the o-ring 54 and orients the o-ring 54 between the head portion 56 and the heat sink 38 during assembly, such as illustrated in FIG. 4.

Returning to FIGS. 2 and 3, the compressible member 54 has a diameter 64 that is configured to expand when the head portion 56 compresses the compressible member 54 and generates the stress on the heat sink 38 as the fastener 52 secures the heat sink 38 to the circuit board component 40. For example, FIG. 4 illustrates the compressible member 54 in an unengaged or unstressed state where the compressible member 54 has the diameter 64. As shown in FIG. 5, as the fastener 52 couples the heat sink 38 to the circuit board component 40, the fastener 52 compresses the compressible member 54 such that the diameter 64 of the compressible member 54 swells beyond a diameter 66 of the head portion 56 to a diameter 65 (e.g., the diameter 65 being larger than the diameter 64). The portion of the compressible member 54 extending beyond the diameter 66 of the head portion 56 forms a reservoir 67 of the compressible member 54.

The reservoir 67 provides a "self-correcting" characteristic to the compressible member 54 in that the reservoir 67 allows the compressible member 54 to absorb changes (e.g., expands or contracts) in response to changes in the stress applied by the fastener 52 to the heat sink 38 and circuit board component 40 over time (e.g., such as caused by exposure of the circuit board assembly to a vibrational or "shock" environment). The compressible member 54, therefore, maintains the stress generated by the fastener 52 on the heat sink 38 and the circuit board component 40 at a substantially constant level.

Assume an assembled circuit board assembly 30 (e.g., a circuit board assembly having a heat sink 38 in thermal contact with a circuit board component 40) experiences a tolerance change or tolerance mismatch between the fastener 52 (e.g., a length of the fastener 52) and the total height of the components of the circuit board assembly 30. For example, assume that the total height of the components (e.g., heat sink base plate 46, thermal interface 48, circuit board component 40) of the circuit board assembly 30 decreases over time, such as caused by aging of the components. Such a decrease creates a tolerance difference between the fastener 52 and the components of the circuit board assembly 30. In such a case, the reservoir 67 allows the diameter 65 of the compressible member 54 to contract (e.g., and allows a height of the compressible member 54 to expand) to account for the tolerance difference or change in tolerance of the circuit board assembly 30. The reservoir 67 allows the compressible member 54 to absorb changes in the stress generated by the head portion 56 of the fastener 50 on the heat sink 38 and, therefore maintains the stress generated by the fastener 52 on the heat sink 38 and the circuit board component 40 at a substantially constant level over time. In the case where the circuit board component 40 has an associated solder ball array 84, the compressible member 54 maintains a stress level on solder balls 85 of a solder ball array 84 to a substantially constant stress level below the stress level that causes creep of the solder balls 85 the solder ball array 84 over time (e.g., below a level of approximately 10 psi).

Returning to FIGS. 2 and 3, in one arrangement, the diameter 64 (e.g., the uncompressed diameter) of the compressible member 54 is greater than the diameter 66 of the head portion 56 of the fastener 52. Such a configuration ensures the presence of a portion of the compressible member 54 extending beyond the diameter 66 of the head portion 56 (e.g., ensures creation of the reservoir 67) when the head portion 56 of the fastener 52 compresses the compressible member 54 against the heat sink 56 when the fastener secures the heat sink to the circuit board component 40.

In one arrangement, the head portion 56 has a diameter 66 of approximately 0.35 inches (8.89 mm). In such an arrangement, the compressible member 54 has a diameter 64 greater than approximately 0.35 inches (8.89 mm). In the case where the diameter 64 of the compressible member 54 is greater than the diameter 66 of the head portion 56, the compressible member 54 can absorb changes in the stress generated by the head portion 56 of the fastener 50 on the heat sink 38 and, therefore, allow the fastener 52 to apply a substantially constant stress to the heat sink 38 and circuit board component 40 over time.

In one arrangement, the fastener 52 is configured as a shoulder screw. In such a configuration, for example, shaft portion 58 of the fastener 52 has a first shaft portion 70 having a first diameter 72 and has a second shaft portion 70 having a second diameter 76. For example, the first shaft portion 70 has a first diameter 72 of approximately 0.197 inches (5.004 mm) and the second shaft portion 74 has a second diameter 76 of approximately 0.118 inches (2.997 mm). In such an arrangement, interface between the first shaft portion 70 and the second shaft portion 74 defines the shoulder or flange 62.

The second shaft portion 74 is configured to couple with side portions or stand-offs 42 attached to the support member 34 when the fastener 52 secures the heat sink 38 to the circuit board component 40. In a conventional circuit board assembly, manufacturers use side portions or stand-offs 42 at certain attachment locations in the circuit board (e.g., attachment locations having openings or through holes 37 as defined by the circuit board 36) to couple the circuit board to corresponding support members 34. In the present arrangement, as shown by FIGS. 4 and 5, an assembler inserts the fastener 52 within an aperture 45 defined by the heat sink 38 and within the existing openings 37 defined by the circuit board 36. The assembler couples the second shaft portion 74 of the fastener 52 with an existing side portion 42 attached to the support member 34 allows a manufacturer to thermally couple and secure the heat sink 38 to the circuit board component 40 without the creating additional mounting holes in the circuit board 36.

Such an arrangement minimizes the use of real estate of the circuit board 36 by minimizing the necessity for the placement of additional through holes in the circuit board 36 for the heat sink attachment mechanisms 50. In this arrangement, use of the heat sink attachment mechanisms 50 also does not require a manufacturer to redesign a circuit board layout (e.g., location of traces and circuit board components) to compensate for the placement of additional through holes in the circuit board 36.

In one arrangement, the second shaft portion 74 includes a threaded surface 78. The threaded surface or threads 78 of the second shaft portion 74 is configured to engage a corresponding tapped inner surface 82 of a stand-off 42 associated with a support member 34. During assembly, as the threads 78 of the second shaft portion 74 engage the inner surface 82 of the stand-offs 42, the head portion 56 of the fastener 52 generates a stress on the heat sink 38 to thermally couple the heat sink 38 to the circuit board component 40. Also, as the threads 78 engage the supports 42 of the support member 34, the fastener secures the heat sink 38 to the circuit board component 40, thereby minimizing the potential for the heat sink 38 to disassociate from the circuit board component 40, such as present with the use of conventional thermal adhesives. Furthermore, during assembly, the threads 78 the second shaft portion 74 draw the support member 34 toward the circuit board 36 and against the stand-offs 42 thereby coupling the circuit board 36 to the support member 34.

Returning to FIG. 2, in one arrangement, the first shaft portion 70 of the fastener 52 defines a length 86 relative to a height 88 of the circuit board assembly 30, as illustrated in FIGS. 4 and 5. The length 86 of the first shaft portion 70 limits deformation of a solder joint 89 between the circuit board component 40 and the circuit board 36. By limiting deformation of the solder joint 89, such as solder balls 85 of a solder ball array 84, the fastener 52 minimizes creep of the solder joint 89 over time and, therefore, limits the potential for fracture of the solder joint 89 as caused by deformation of the solder joint 89.

For example, as shown in FIG. 2, the first shaft portion 70 defines the length 86 as the distance between the flange 62 (e.g., the interface between the first shaft portion 70 and the second shaft portion 74) and the intersection location between the head portion 56 and the first shaft portion 70. In one arrangement, the length 86 is approximately 0.25 inches (6.35 mm). The length 86 accounts for the height 88 of the components of the circuit board assembly 30 such that when the fastener 52 secures the heat sink 38 to the circuit board component 40, the fastener 52 (e.g., the head portion 56 of the fastener 52) generates a predetermined stress on the solder joint 89 while maintaining thermal contact between the heat sink 38 and the circuit board component. For example, the length 86 of the first shaft portion 70 accounts for the heights of the solder ball array 84, the circuit board component 40, the thermal interface layer 48, the base plate 46 of the heat sink 38, and the compressible member 54. When the fastener 52 secures the heat sink 38 to the circuit board component 40, the length 86 of the first shaft portion 70 allows the fastener 52 to generate a stress of approximately 10 psi on the solder joint 89 between the circuit board component 40 and the circuit board 36 while maintaining thermal contact between the heat sink 38 and the circuit board component 40. The stress of approximately 10 psi minimizes deformation of the solder joint 89 during the operational life of the circuit board assembly and thereby minimizes the risk of failure of the solder joint 89.

Figure 6:
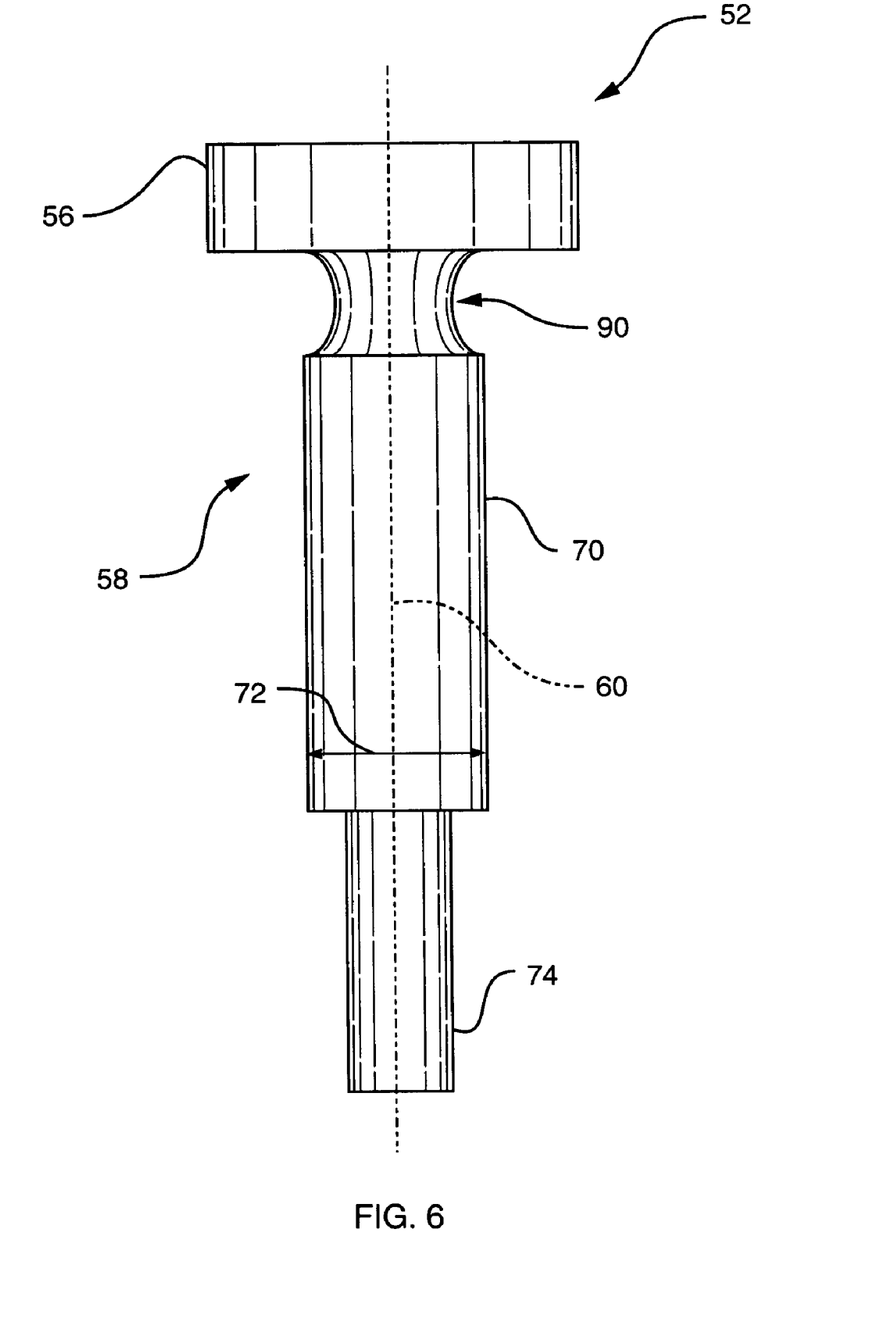
FIG. 6 illustrates a fastener of the heat sink attachment mechanism, according to one embodiment of the invention.

FIG. 6 illustrates an arrangement of the fastener 52 where the shaft portion 58 defines a trough portion 90 of the fastener 52. The trough portion 90 extends along the shaft portion 58 about, and substantially perpendicular to, the long axis 60 of the shaft portion 58. The trough portion 90 is configured to secure a compressible member 54, such as an o-ring, to the fastener 52 while limiting the potential for the compressible member 54 to disengage (e.g., slide off) the fastener 52 because of tolerance differences between the shaft portion 58 of the fastener 52 and the compressible member 54.

For example, during assembly of the heat sink attachment mechanism 50 an assembler inserts the shaft portion 58 within an aperture 60 defined by the compressible member 54 where the inner diameter of the aperture is approximately equal to the diameter 72 of the shaft portion 58. When the compressible member 54 engages the trough portion 90, the compressible member 54 (e.g., the surface of the compressible member 54 defining the aperture 60) conforms to the trough portion 90. The trough portion 90 creates an interference fit with the compressible member 54, thereby preventing the compressible member 54 from traveling along the long axis 60 of the shaft portion 58 and disassociating from the fastener 90.

The trough portion 90 also allows a manufacturer to provide the heat sink attachment mechanism 50 as a pre-assembled unit having both the fastener 52 and the compressible member 54 and minimizes the potential of providing the heat sink attachment mechanism 50 without a compressible member 54. By providing the heat sink attachment mechanism 50 as a pre-assembled unit, the manufacturer saves the end user manufacturing costs.

The trough portion 90 is further configured to secure the fastener 52 and the compressible member 54 such that the compressible member 54 couples to the fastener 52 in a minimally expanded or "at rest" state. For example, during assembly, a manufacturer engages the shaft portion 58 with the aperture 55 of the compressible member 54 where a diameter of the aperture is less than the diameter 66 of the shaft portion 58. To ensure contact between the shaft portion 58 and the compressible member 54, and to secure the compressible member 54 to the fastener 52, the shaft portion 58 generates a radial load (e.g., preload) along the aperture 55 of the compressible member 54. Such radial load expands the diameter 64 of the compressible member 54.

As the compressible member 54 engages the trough portion 90, the compressible member 54 retracts within the trough portion 90 to a minimally expanded or "at rest" state. For example, the trough portion 90 reduces or minimizes the amount of radial loading on the compressible member 54, thereby allowing substantial retraction of the compressible member 54 to its initial diameter 66. In the minimally expanded state, when the fastener 52 compresses the compressible member 54 against the heat sink 38 the compressible member 54 can more readily expand, compared to a preloaded compressible member, and allow the compressible member 54 to absorb changes in the stress applied by the fastener 52 to the heat sink 38 and circuit board component 40 over time.

Figure 7:
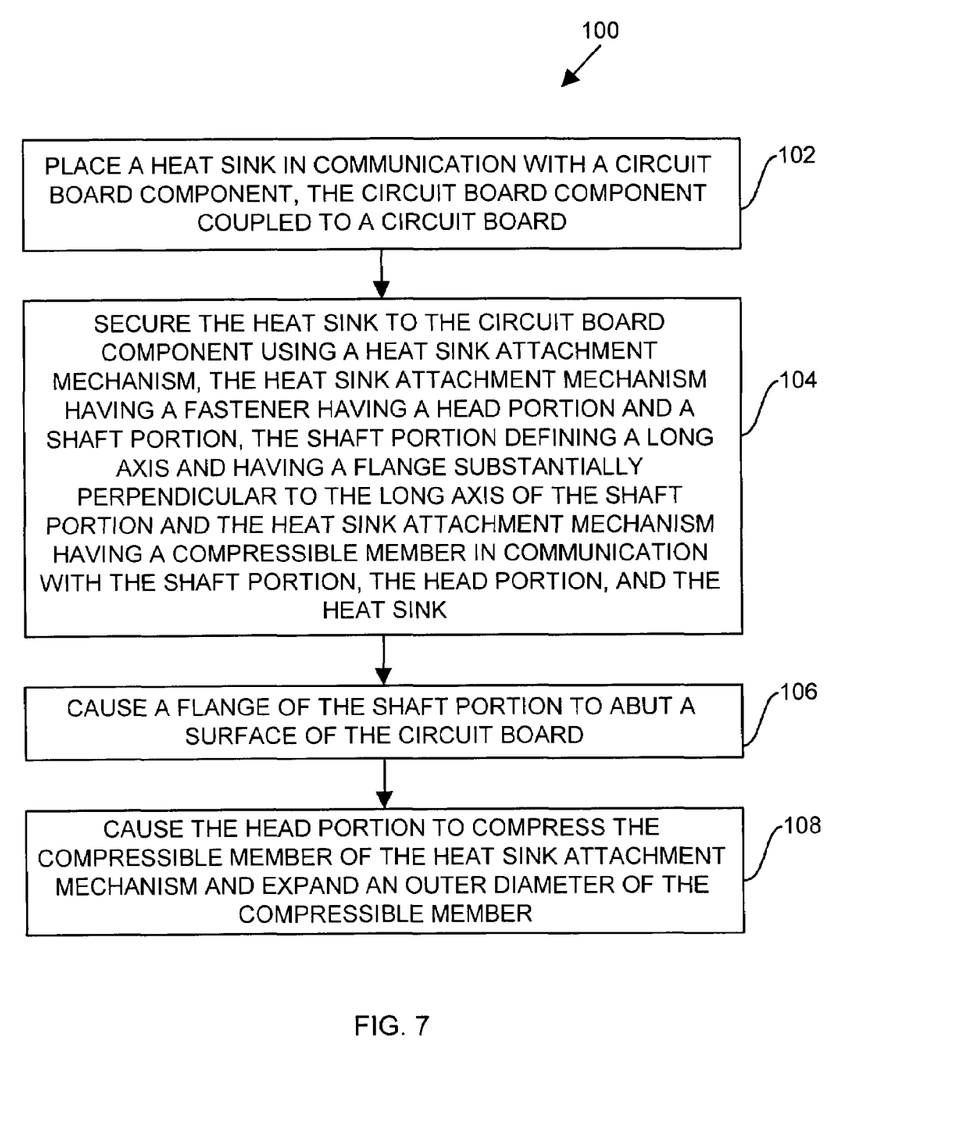
FIG. 7 illustrates a flowchart of procedure for assembling a heat sink attachment mechanism, according to one embodiment of the invention.

FIG. 7 illustrates a method 100 for assembling a circuit board assembly 20, according to one embodiment of the invention. Such a method can be performed either manually (e.g., by a technician on an assembly line) or automatically (e.g., by automated equipment).

In step 102, an assembler places a heat sink 38 in communication with a circuit board component 40, the circuit board component 40 coupled to a circuit board 36. In one arrangement, the circuit board component 40 has a thermal interface material 48 such that the heat sink 38 contacts the thermal interface material 48 (e.g., the heat sink 38 indirectly contacts the circuit board component 40)

In step 104, the assembler secures the heat sink 38 to the circuit board component 40 using a heat sink attachment mechanism 50, the heat sink attachment mechanism 50 having a fastener 52 having a head portion 56 and a shaft portion 58, the shaft portion 58 defining a long axis 60 and having a flange 62 substantially perpendicular to the long axis 60 of the shaft portion 58 and the heat sink attachment mechanism 50 having a compressible member 54 in communication with the shaft portion 58, the head portion 56, and the heat sink 38.

In step 106, the assembler causes the flange 62 of the shaft portion 58 to abut a surface 35 of the circuit board 36. For example, the assembler applies torque to the fastener 52 until the flange 62 contacts the surface 35 of the circuit board 36. Contact between the flange 62 and the circuit board 36 causes the fastener 52 to limit the amount of stress applied to the heat sink 38, the circuit board component 40 and a solder joint 89 located between the circuit board component 40 and the circuit board when the fastener 52 secures the heat sink 38 to the circuit board component 40.

In step 108, the assembler causes the head portion 56 to compress the compressible member 54 of the heat sink attachment 50 and expand an outer diameter 65 of the compressible member 54. For example, the assembler applies torque to the fastener 52 and causes the head portion 56 to compress the compressible member 54 until a portion of the compressible member 54 extends beyond a diameter 66 of the head portion 56 to form a reservoir 67 of the compressible member 54. The reservoir 67 provides a "self-correcting" characteristic to the compressible member 54 in that the reservoir 67 allows the compressible member 54 to absorb changes (e.g., expands or contracts) in response to changes in the stress applied by the fastener 52 to the heat sink 38 and circuit board component 40 over time, such as caused by changes in the heights of the circuit board components due to aging over time.

While this invention has been particularly shown and described with references to preferred embodiments thereof, it will be understood by those skilled in the art that various changes in form and details may be made therein without departing from the spirit and scope of the invention as defined by the appended claims.

The compressible member 54, in one arrangement, is formed from a compliant elastomeric material, such as a silicone rubber material. For example, the compressible member 54 is an o-ring formed from a silicone rubber material having a durometer value of Shore A 70 (e.g., such as manufactured by Electronic Eyelet Inc.). In another arrangement, the compressible member 54 is formed from one or more Bellville washers.

In one arrangement, the fastener 52 is formed of an electrically conductive material. As shown in FIG. 4, the fastener 52 mechanically couples to the standoff 42 and support member 34. In one arrangement, the fastener 52 electrically couples to the standoff and support member 34 where the standoff and support member 34 provide a ground path. The electrically conductive fastener 52, therefore, provides electromagnetic interference (EMI) protection to the circuit board component 40.

In one arrangement, the compressible member 54 is formed of an electrically conductive material. For example, the compressible member 54 is formed from an elastomeric material that incorporates a nickel-based fabric to provide conductivity to the compressible member 54. In combination with the electrically conductive fastener 52, the heat sink 38, and the support member 34, the electrically conductive compressible member 54 aids in providing an EMI shield or EMI protection for a circuit board component 40 in proximity to the compressible member 54.

As shown above, FIG. 4 illustrates the heat sink attachment mechanism 50 securing the heat sink 38 to a single circuit board component 40. Such illustration is by way of example only. In one arrangement, the heat sink attachment mechanism 50 secures the heat sink 38 to multiple circuit board components 40 associated with the circuit board 36.

FIGS. 4 and 5 illustrate the circuit board assembly as using two heat sink attachment mechanisms 50 to secure the heat sink to the circuit board component 40. In one arrangement, the circuit board assembly 30 can utilize more than two heat sink attachment mechanisms 50 to secure the heat sink 38 to the circuit board component 40. For example, in one arrangement, four heat sink attachment mechanisms 50 couple to the heat sink 38 to the circuit board component 40. In such an arrangement, each heat sink attachment mechanism 50 is located at one of the four corners of the heat sink 38. The use of four heat sink attachment mechanisms 50 in such a configuration distributes the stress from the heat sink substantially evenly over the surface of the circuit board component 40.

Such variations are intended to be covered by the scope of this invention. As such, the foregoing description of embodiments of the invention is not intended to be limiting. Rather, any limitations to the invention are presented in the following claims.

What is claimed is:

1. A heat sink attachment mechanism comprising:
a fastener having a head portion and a shaft portion, the head portion configured to generate a stress on a heat sink to secure the heat sink with a circuit board component and the shaft portion having a flange substantially perpendicular to a long axis defined by the shaft portion, the flange configured to abut a surface of a circuit board carrying the circuit board component when the fastener secures the heat sink to the circuit board component; and
a compressible member in communication with the shaft portion of the fastener and configured to orient between the head portion and the heat sink, the compressible member having a diameter configured to expand when the head portion compresses the compressible member and generates the stress on the heat sink when the fastener secures the heat sink to the circuit board component;
wherein a trough portion is defined by the shaft portion of the fastener, the trough portion extending along the shaft portion about, and substantially perpendicular to, the long axis of the shaft portion, the trough portion configured to secure the compressible member to the fastener.

2. The heat sink attachment mechanism of claim 1 wherein the shaft portion comprises a first shaft potion having a first diameter and a second shaft portion having a second diameter less than the first diameter of the first shaft portion, an interface between the first shaft potion and the second shaft portion defining the flange, the second shaft portion configured to couple with a side portion of a support member associated with the circuit board when the fastener secures the heat sink to the circuit board component.

3. The heat sink attachment mechanism of claim 2 wherein the first shaft potion of the fastener defines a length relative to a height of a circuit board assembly such that the length of the first shaft portion limits deformation of a solder joint between the circuit board component and the circuit board.

4. The heat sink attachment mechanism of claim 1 wherein the diameter of the compressible member is greater than a diameter of the head portion of the fastener.

5. The heat sink attachment mechanism of claim 1 wherein the compressible member comprises an electrically conductive material.

6. A heat sink apparatus for cooling a circuit board component mounted to a circuit board, the heat sink apparatus comprising:
a heat sink; and
a heat sink attachment mechanism comprising:
a fastener having a head portion and a shaft portion, the head portion configured to generate a stress on the heat sink to secure the heat sink with a circuit board component and the shaft portion having a flange substantially perpendicular to a long axis defined by the shaft portion, the flange configured to abut a surface of a circuit board carrying the circuit board component when the fastener secures the heat sink to the circuit board component; and
a compressible member in communication with the shaft portion of the fastener and configured to orient between the head portion and the heat sink, the compressible member having a diameter configured to expand when the head portion compresses the compressible member and generates the stress on the heat sink when the fastener secures the heat sink to the circuit board component;
wherein a trough portion is defined by the shaft portion of the fastener, the trough portion extending along the shaft portion about, and substantially perpendicular to, the long axis of the shaft portion, the trough portion configured to secure the compressible member to the fastener.

7. The heat sink apparatus of claim 6 wherein the shaft portion comprises a first shaft potion having a first diameter and a second shaft portion having a second diameter less than the first diameter of the first shaft portion, an interface between the first shaft potion and the second shaft portion defining the flange, the second shaft portion configured to couple with a side portion of a support member associated with the circuit board when the fastener secures the heat sink to the circuit board component.

8. The heat sink apparatus of claim 7 wherein the first shaft potion of the fastener defines a length relative to a height of a circuit board assembly such the length of the first shaft portion limits deformation of a solder joint between the circuit board component and the circuit board.

9. The heat sink apparatus of claim 6 wherein the diameter of the compressible member is greater than a diameter of the head portion of the fastener.

10. The heat sink apparatus of claim 6 wherein the compressible member comprises an electrically conductive material.

11. A circuit board assembly comprising:
a circuit board and a circuit board component mounted to the circuit board;
a heat sink apparatus for cooling the circuit board component, the heat sink apparatus including:
a heat sink; and
a heat sink attachment mechanism comprising:
a fastener having a head portion and a shaft portion, the head portion configured to generate a stress on the heat sink to secure the heat sink with the circuit board component and the shaft portion having a flange substantially perpendicular to a long axis defined by the shaft portion, the flange configured to abut a surface of the circuit board carrying the circuit board component when the fastener secures the heat sink to the circuit board component; and
a compressible member in communication with the shaft portion of the fastener and configured to orient between the head portion and the heat sink, the compressible member having a diameter configured to expand when the head portion compresses the compressible member and generates the stress on the heat sink when the fastener secures the heat sink to the circuit board component;
wherein a trough portion is defined by the shaft portion of the fastener, the trough portion extending along the shaft portion about, and substantially perpendicular to, the long axis of the shaft portion, the trough portion configured to secure the compressible member to the fastener.

12. The circuit board assembly of claim 11 wherein the shaft portion comprises a first shaft potion having a first diameter and a second shaft portion having a second diameter less than the first diameter of the first shaft portion, an interface between the first shaft potion and the second shaft portion defining the flange, the second shaft portion configured to couple with a side portion of a support member associated with the circuit board when the fastener secures the heat sink to the circuit board component.

13. The circuit board assembly of claim 12 wherein the first shaft potion of the fastener defines a length relative to a height of a circuit board assembly such that the length of the first shaft portion limits deformation of a solder joint between the circuit board component and the circuit board.

14. The circuit board assembly of claim 11 wherein the diameter of the compressible member is greater than a diameter of the head portion of the fastener.

15. The circuit board assembly of claim 11 wherein the compressible member comprises an electrically conductive material.

16. A heat sink attachment mechanism comprising:
a fastening means having a head means and a shaft means, the head means to generate a stress on a heat sink to secure the heat sink with a circuit board component and the shaft means defining a long axis and having a flange substantially perpendicular to the long axis, the flange configured to abut a surface of a circuit board carrying the circuit board component when the fastening means secures the heat sink to the circuit board component; and
a compressible means in communication with the shaft means of the fastening means and configured to orient between the head means and the heat sink, the compressible means having a diameter configured for expanding when the head means compresses the compressible means and generates the stress on the heat when the fastening means secures the heat sink to the circuit board component;
wherein a trough portion is defined by the shaft means of the fastening means, the trough portion extending along the shaft means about, and substantially perpendicular to, the long axis of the shaft means, the trough portion configured to secure the compressible means to the fastening means.

17. A method for assembling a circuit board assembly comprising:
placing a heat sink in communication with a circuit board component, the circuit board component coupled to a circuit board;
securing the heat sink to the circuit board component using a heat sink attachment mechanism, the heat sink attachment mechanism having a fastener having a head portion and a shaft portion, the shaft portion defining a long axis and having a flange substantially perpendicular to the long axis of the shaft portion and the heat sink attachment mechanism having a compressible member in communication with the shaft portion, the head portion, and the heat sink;
causing the flange of the shaft portion to abut a surface of the circuit board; and
causing the head portion to compress the compressible member of the heat sink attachment mechanism and expand an outer diameter of the compressible member, the compressible member comprising a compliant elastomeric material;
the method further comprising inserting the compressible member within a trough portion defined by the shaft portion of the fastener, the trough portion extending along the shaft portion about, and substantially perpendicular to, the long axis of the shaft portion, to secure the compressible member to the fastener.

18. The method of claim 17, further comprising:
engaging part of the shaft portion of the fastener with a circuit board support mount, the shaft portion defining a first shaft potion having a first diameter and a second shaft portion having a second diameter less than the first diameter of the first shaft portion, an interface between the first shaft potion and the second shaft portion defining the flange.

19. A heat sink attachment mechanism comprising:
a fastener having a head portion, an intermediate portion, a shaft portion and a securing portion, the head portion configured to generate a stress on a heat sink to secure the heat sink with a circuit board component, the intermediate portion having a flange substantially perpendicular to a long axis defined by the shaft portion, the flange configured to abut a surface of a circuit board carrying the circuit board component, and the securing portion configured to secure the circuit board to a support mount when the fastener secures the heat sink to the circuit board component; and
a compliant o-ring in communication with the shaft portion of the fastener and configured to orient between the head portion and the heat sink, the compliant o-ring having a diameter configured to expand when the head portion compresses the compressible member and generates the stress on the heat sink when the fastener secures the heat sink to the circuit board component;
wherein a trough portion is defined by the shaft portion of the fastener, the trough portion extending along the shaft portion about, and substantially perpendicular to, the long axis of the shaft portion, the trough portion configured to secure the compliant o-ring to the fastener.

20. The heat sink attachment mechanism of claim 1 wherein the elastomeric material defines an o-ring structure which is configured to retain the compressible member onto a side of the shaft portion of the fastener.

21. The heat sink attachment mechanism of claim 20 wherein a cross-section of the o-ring structure is configured to substantially flatten in response to compression due to fastening of the heat sink to the circuit board component by the heat sink attachment mechanism.

22. The heat sink apparatus of claim 6 wherein the elastomeric material defines an o-ring structure which is configured to retain the compressible member onto a side of the shaft portion of the fastener.

23. The heat sink apparatus of claim 22 wherein a cross-section of the o-ring structure is configured to substantially flatten in response to compression due to fastening of the heat sink to the circuit board component by the heat sink attachment mechanism.

24. The circuit board assembly of claim 11 wherein the elastomeric material defines an o-ring structure which is configured to retain the compressible member onto a side of the shaft portion of the fastener.

25. The circuit board assembly of claim 24 wherein a cross-section of the o-ring structure is configured to substantially flatten in response to compression due to fastening of the heat sink to the circuit board component by the heat sink attachment mechanism.

26. The method of claim 17 wherein the elastomeric material defines an o-ring structure which is configured to retain the compressible member onto a side of the shaft portion of the fastener.

27. The method of claim 26 wherein a cross-section of the o-ring structure is configured to substantially flatten in response to compression due to fastening of the heat sink to the circuit board component by the heat sink attachment mechanism.

28. The heat sink attachment mechanism of claim 1 wherein the compressible member comprises a compliant elastomeric material.

29. The heat sink apparatus of claim 6 wherein the compressible member comprises a compliant elastomeric material.

30. The circuit board assembly of claim 11 wherein the compressible member comprises a compliant elastomeric material.

* * * * *

UNITED STATES PATENT AND TRADEMARK OFFICE
CERTIFICATE OF CORRECTION

PATENT NO. : 7,064,957 B1  
APPLICATION NO. : 10/614908  
DATED : June 20, 2006  
INVENTOR(S) : Hsing-Sheng Liang et al.

Page 1 of 1

It is certified that error appears in the above-identified patent and that said Letters Patent is hereby corrected as shown below:

Column 4, Line 9, "potion" should read --portion--.  
Column 4, Line 11, "potion" should read --portion--.  
Column 4, Line 20, "potion" should read --portion--.

Claim 2, Column 13, Line 27, "potion" should read --portion--.  
Claim 2, Column 13, Line 30, "potion" should read --portion--.  
Claim 3, Column 13, Line 36, "potion" should read --portion--.  
Claim 7, Column 14, Line 10, "potion" should read --portion--.  
Claim 7, Column 14, Line 13, "potion" should read --portion--.  
Claim 8, Column 14, Line 19, "potion" should read --portion--.  
Claim 12, Column 14, Line 62, "potion" should read --portion--.  
Claim 12, Column 14, Line 65, "potion" should read --portion--.  
Claim 13, Column 15, Line 4, "potion" should read --portion--.

Signed and Sealed this

Nineteenth Day of September, 2006

JON W. DUDAS  
*Director of the United States Patent and Trademark Office*